United States Patent [19]

Yotsuyanagi

[11] Patent Number: 5,159,342
[45] Date of Patent: Oct. 27, 1992

[54] SERIAL-PARALLEL TYPE ANALOGUE/DIGITAL CONVERTER

[75] Inventor: Michio Yotsuyanagi, Tokyo, Japan

[73] Assignee: NEC Corporation, Japan

[21] Appl. No.: 703,822

[22] Filed: May 21, 1991

[30] Foreign Application Priority Data

May 22, 1990 [JP] Japan .................................. 2-131792

[51] Int. Cl.⁵ .............................................. H03M 1/42
[52] U.S. Cl. .................................... 341/161; 341/156
[58] Field of Search .................... 341/156, 161, 162

[56] References Cited

U.S. PATENT DOCUMENTS

| 4,144,525 | 3/1979  | O'Neill        | 341/156 |
| 4,410,876 | 10/1983 | Sawagata       | 341/156 |
| 4,559,523 | 12/1985 | Wakita         | 341/156 |
| 4,763,107 | 8/1988  | Koen et al.    | 341/161 |
| 4,875,048 | 10/1989 | Shimizu et al. | 341/156 |
| 4,973,974 | 11/1990 | Suzuki         | 341/118 |

OTHER PUBLICATIONS

"A 12-bit Low Power Consumption CMOS Recursive Subranging A/D Conversion IC"; Microelectronics Research Labs; NEC Corp., 1989.

"A High-Speed High-gain CMOS Operational Amplifier"; Microelectronics Research Labs; NEC Corp., 1989.

*Primary Examiner*—Marc Hoff
*Attorney, Agent, or Firm*—Leydig, Voit & Mayer

[57] ABSTRACT

A serial-parallel type A/D converter comprises first and second circuit blocks which are connected serially to operate in pipe lining. An input analogue signal is converted to a digital signal having highest significant bits at the first circuit block, and an analogue signal obtained by subtracting an analogue signal equal in value to the digital signal from the input analogue signal is converted at the second circuit block. The second circuit block is a recursive circuit block in which A/D converting operation is carried out for a plurality of cycles at the timing of several times faster than that of the first circuit block.

7 Claims, 5 Drawing Sheets

SERIAL-PARALLEL TYPE ANALOGUE/DIGITAL CONVERTER

FIELD OF THE INVENTION

This invention relates to an analogue/digital (A/D) converter, and more particularly to, a serial-parallel type A/D converter for converting an analogue signal to a digital signal by serially combining plural bit groups obtained in a predetermined bit significant order.

BACKGROUND OF THE INVENTION

A first conventional serial-parallel type A/D converter comprises a recursive circuit consisting of a first sample holding circuit for sampling and holding an analogue signal, a 4-bit parallel A/D converter which converts the analogue signal to a 4-bit digital code number, a digital/analogue (D/A) converter which converts the 4-bit digital code number to an analogue signal, a subtracter which subtracts the converted analogue signal from the sampled analogue signal and amplifies the result of subtraction by four times, a second sample holding circuit for sampling and holding an output signal of the subtracter and amplifies the sampled signal by twice, and a switch which selectively connects inputs of the 4-bit parallel A/D converter and the first sample holding circuit with either an input terminal of the serial-parallel type A/D converter to which an original input analogue signal is supplied or an output of the second sample holding circuit.

In operation, in the first cycle, the switch connects terminals so that the input analogue signal is supplied to both the first sample holding circuit and the 4-bit parallel A/D converter. The sample holding circuit samples the input analogue signal to hold the sampled input signal for a predetermined period. The 4-bit parallel A/D converter converts the input analogue signal to a first 4-bit digital code number corresponding to first highest significant bits of the sampled input analogue signal. Then, the D/A converter converts the first 4-bit digital code number to an analogue signal which corresponds to the first highest significant bits of the sampled input analogue signal. Then, the subtracter subtracts the converted analogue signal form the the sampled input analogue signal and amplifies the result of subtraction by four times. The second sample holding circuit samples an output signal of the subtracter and amplifies the sampled output signal by twice and holds the amplified result for a predetermined period. As a result, the second sample holding circuit generates an output signal which is an amplified value by eight times of the result of subtraction of the analogue signal supplied by the D/A converter from the sampled input analogue signal.

Next, in the second to fourth cycles, the switch connects terminals so that an output of the second sample holding circuit is supplied to inputs of the first sample holding circuit and the 4-bit parallel A/D converter. Then, the same converting operation of the first cycle described above is carried out in the second to fourth cycles to obtain second to fourth 4-bit digital code numbers corresponding to second to fourth highest significant bits of the sampled input analogue signal, respectively.

By carrying out the converting operations of the first to fourth cycles described above, the first to fourth 4-bit digital code numbers respectively corresponding to the first to fourth highest significant bits of the input analogue signal can be obtained, provided that the four 4-bit digital code numbers overlap at the most and least significant bits of the adjacent code numbers by one bit, so that the resultant digital code number which corresponds to the original input analogue signal is a 13-bit digital code number in accordance with the bit combination of $(4 \times 4 - 3$ bits$)$.

A second conventional serial-parallel type A/D converter comprises first to third circuit blocks serially connected and a 4-bit parallel A/D converter serially connected to an output of the third circuit block. Each of the first to third circuit blocks comprises a first sample holding circuit which samples and holds an input analogue single, a 4-bit parallel A/D converter which converts the input analogue signal to a 4-bit digital code number, a D/A converter which converts the 4-bit digital code number to an analogue signal, a subtracter which subtracts the converted analogue signal from the sampled input analogue signal and amplifies the result of subtraction by four times, and a second sample holding circuit which samples an output of the subtracter and amplifies the sampled signal by twice and holds the amplified value.

Outputs of the first and second circuit blocks are respectively supplied to inputs of the second and third circuit blocks, and the output of the third circuit block is supplied to an input of the 4-bit parallel A/D converter.

In operation, the same converting operation as that in each cycle of the first conventional serial-parallel type A/D converter is carried out in each of the first to third circuit blocks sequentially, and first to fourth 4-bit digital code numbers respectively corresponding to first to fourth highest significant bits of the input analogue signal can be obtained in the first to third circuit blocks and the 4-bit A/D converter connected to the third circuit block, respectively, in pipe lining operation. Thus, a 13-bit digital signal is generated by the bit combination as described in the first conventional serial-parallel type A/D converter.

According to the first and second conventional serial-parallel type A/D converters, however, there are disadvantages as described after.

In the first conventional serial-parallel type A/D converter, the operation time for obtaining the 13-bit digital code number corresponding to the input analogue signal is relatively long, because the four cycles must be carried out to convert the input analogue signal to the digital code number. The operation time of one cycle depends on the precision of A/D conversion, so that it is difficult to shorten the converting operation time without reducing the precision of A/D conversion which is of 13 bits in the first conventional serial-parallel type A/D converter.

In the second conventional serial-parallel type A/D converter, the converting operation time is approximately one fourth of that in the first conventional serial-parallel type A/D converter, however, a chip area and a power consumption of the converter are four times of those of the first conventional serial-parallel type A/D converter.

SUMMARY OF THE INVENTION

Accordingly, it is an object of the invention to provide a serial-parallel type A/D converter in which both converting operation time and power consumption thereof are reduced with the suppression of the chip area increase.

According to the invention, a serial-parallel type A/D converter comprises:

a first circuit block for converting an input analogue signal to a first digital code number consisting of first highest significant bits;

a second circuit block for converting an analogue signal, which is obtained by subtracting an analogue signal equal in value to the first digital code number from the input analogue signal, to second and later digital code numbers consisting of second and later highest significant bits, respectively, the second circuit block being a recursive circuit in which the converting is carried out for plural times at a timing faster than that of the first circuit block to obtain the second and later digital code numbers;

wherein the first and second circuit block operates in pipe lining to convert the input analogue signal to a digital signal obtained by combining the first, second and later highest significant bits.

BRIEF DESCRIPTION OF THE DRAWINGS

The invention will be explained in more detail in conjunction with appended drawings wherein.

DESCRIPTION OF THE PREFERRED EMBODIMENTS

Before describing a serial-parallel type A/D converters in preferred embodiments according to the invention, the conventional serial-parallel type A/D converters described before will be explained in conjunction with FIGS. 1 and 2.

Figure 1:
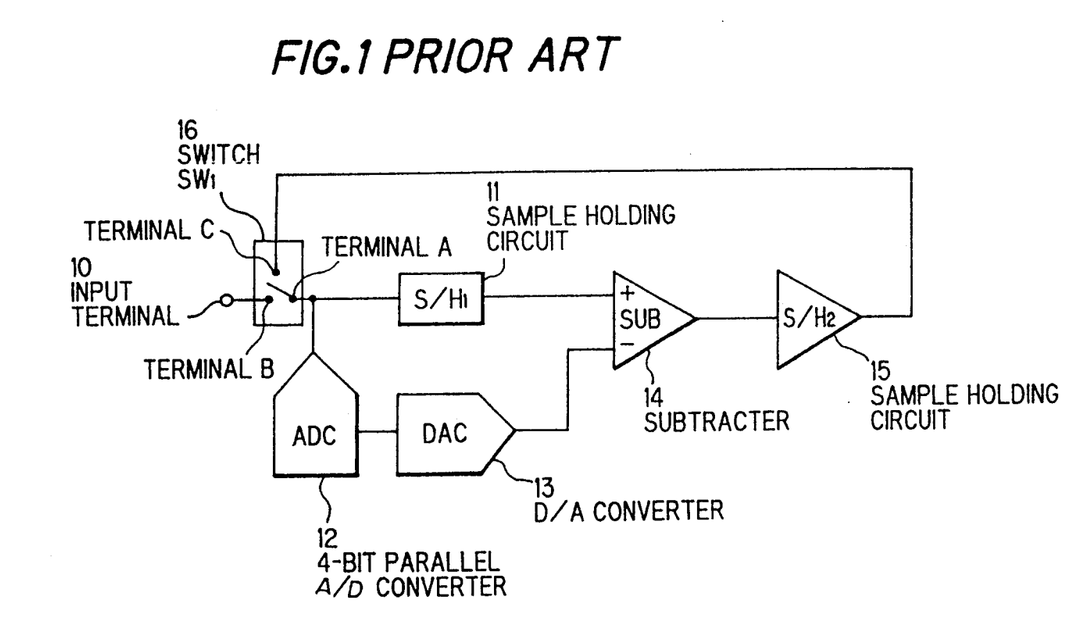
FIG. 1 is a block diagram of a first conventional serial-parallel type A/D converter.

FIG. 1 is a block diagram of a first conventional serial-parallel type A/D converter which is described in "12-bit low consumption power CMOS recursive type serial-parallel type A/D converter IC" of Electro Information Communication Society Technical Researching Report, ICD-116.

In the serial-parallel type A/D converter shown in FIG. 1, a reference numeral 11 denotes a first sample holding circuit 11, 12 a 4-bit parallel A/D converter, 13 a D/A converter, 14 a subtracter, 15 a second sample holding circuit, and 16 a switch.

The operation of the first conventional serial-parallel type A/D converter has been described before, so that the explanation thereof will not be carried out.

In this serial-parallel type A/D converter, it takes four cycles to convert an analogue signal to a 13-bit digital code number. If one period of one cycle is defined to be $T_{s0}$, the converting time becomes $4T_{s0}$. The number of electric elements composing the converter is relatively small, so that the chip area for the converter is as narrow as approximately 3.9 mm². The power consumption thereof is approximately 25 mW, and the converting speed thereof is 200 Ksample/sec (200 Ksps). Therefore, $T_{s0}$ is calculated as follows.

$$T_{s0} = (1/4) \times (1/200)$$
$$= 1.25 \, \mu s$$

Figure 2:
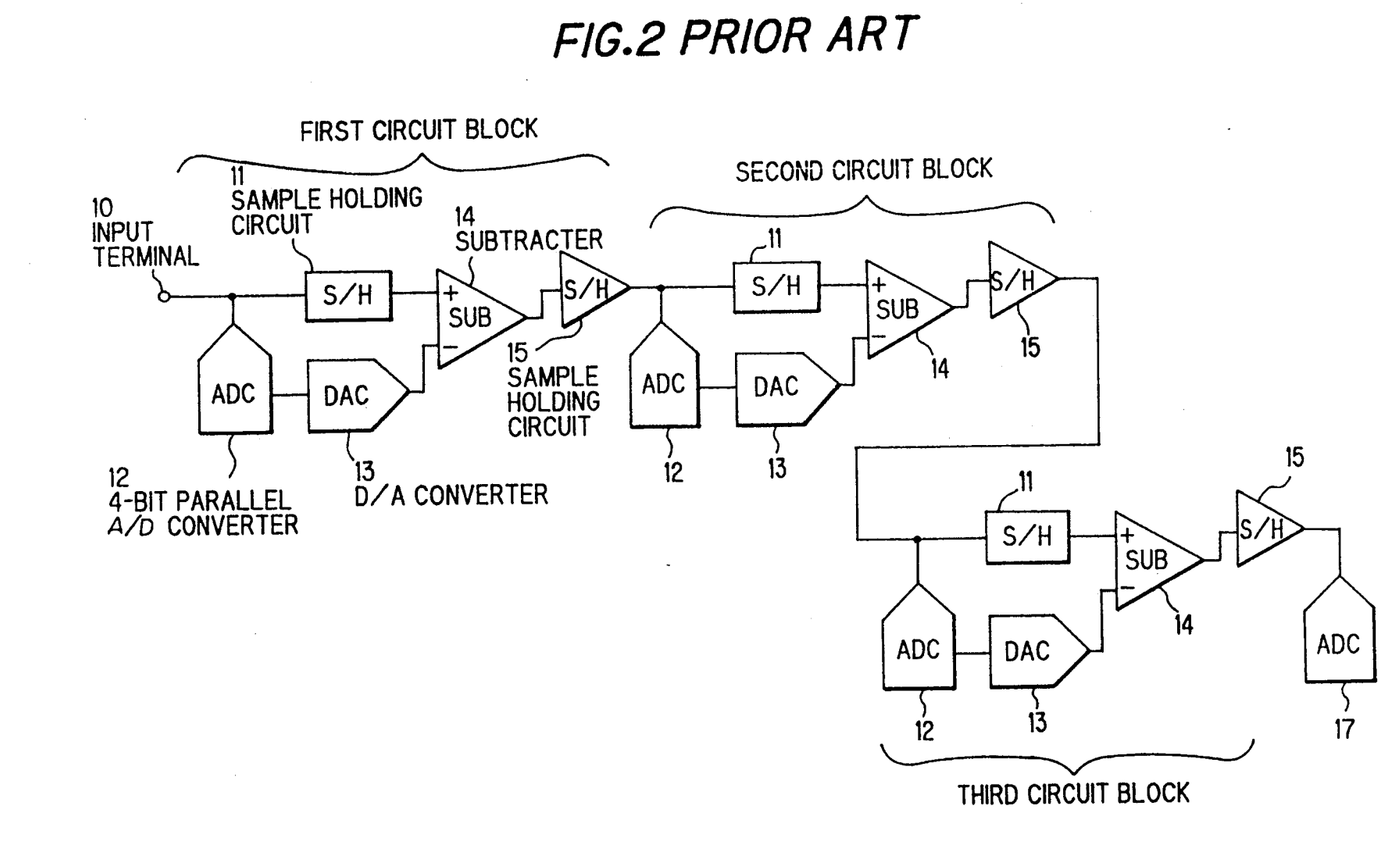
FIG. 2 is a block diagram of a second conventional serial-parallel type A/D converter.

FIG. 2 is a block diagram of a second conventional serial-parallel type A/D converter which converts an analogue signal to a digital signal in pipe lining operation.

The second conventional serial-parallel A/D converter comprises first to third circuit blocks serially connected and a 4-bit parallel A/D converter 17 serially connected to an output of the third circuit block. Each of the first to third circuit blocks comprises a first sample holding circuit 11, a 4-bit parallel A/D converter 12, a D/A converter 13, a subtracter 14, and a second sample holding circuit 15.

In this serial-parallel type A/D converter, the converting speed thereof is as fast as approximately 800 Ksps, however, the chip area for the converter is as large as approximately 15 mm² and the power consumption thereof is approximately 100 mW, which are four times as those of the first conventional serial-parallel type A/D converter.

The precision which is needed for conversion is 13 bits in the first circuit block, 10 bits in the second circuit block, 7 bits in the third circuit block, and 4 bits in the 4-bit parallel A/D converter 17 corresponding to the fourth block. However, the converting time depends on the largest precision among the circuit blocks, that is 13 bits in the first circuit block, so that the second and later circuit blocks have precision characteristics more than needed.

Figure 3:
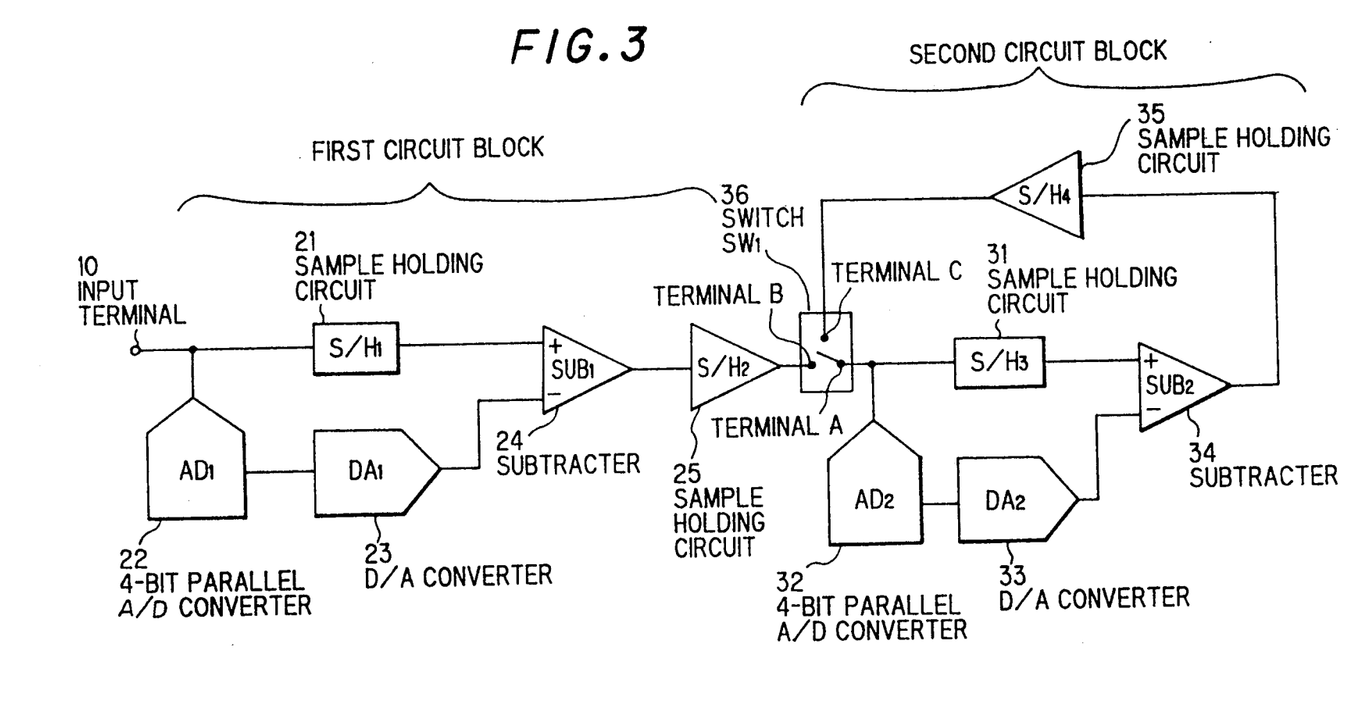
FIG. 3 is a block diagram of a serial-parallel type A/D converter in a first preferred embodiment according to the invention.

FIG. 3 is a block diagram of a serial-parallel A/D converter in a first preferred embodiment. The serial-parallel type A/D converter comprises first and second circuit blocks which are connected each other in serial.

The first circuit block comprises a first sample holding circuit 21 which samples an input analogue signal and holds the sampled analogue signal, a 4-bit parallel A/D converter 22 which converts the input analogue signal to a 4-bit digital code number, a D/A converter 23 which converts the 4-bit digital code number to an analogue signal, a subtracter 24 which subtracts the converted analogue signal from the sampled input analogue signal and amplifies the result of subtraction by four times, and a second sample holding circuit 25 which samples an output of the subtracter 24 and amplifies the sampled signal by twice and holds the result of the amplified value.

The second circuit block comprises a first sample holding circuit 31 which samples an input analogue signal and holds the sampled analogue signal, a 4-bit parallel A/D converter 32 which converts the input analogue signal to a 4-bit digital code number, a D/A converter 33 which converts the 4-bit digital code number to an analogue signal, a subtracter 34 which subtracts the converted analogue signal from the sampled input analogue signal and amplifies the result of subtraction by four times, a second sample holding circuit 35 which samples an output of the subtracter 34 and increases the sampled output by twice and holds the result of the amplified value, and a switch 36 which selectively connects a terminal A which is connected to both inputs of the first sample holding circuit 21 and the 4-bit parallel A/D converter 32 with either a terminal B which is connected to an output of the second sample holding circuit 25 of the first circuit block or a terminal C which is connected to an output of the second sample holding circuit 35 of the second circuit block.

In this serial-parallel type A/D converter, the relation between one cycle periods $T_1$ and $T_2$ in the first and second circuit blocks is as follows.

$$T_1 = mT_2 \text{ (m is an integer over 1)}$$

Figure 4:
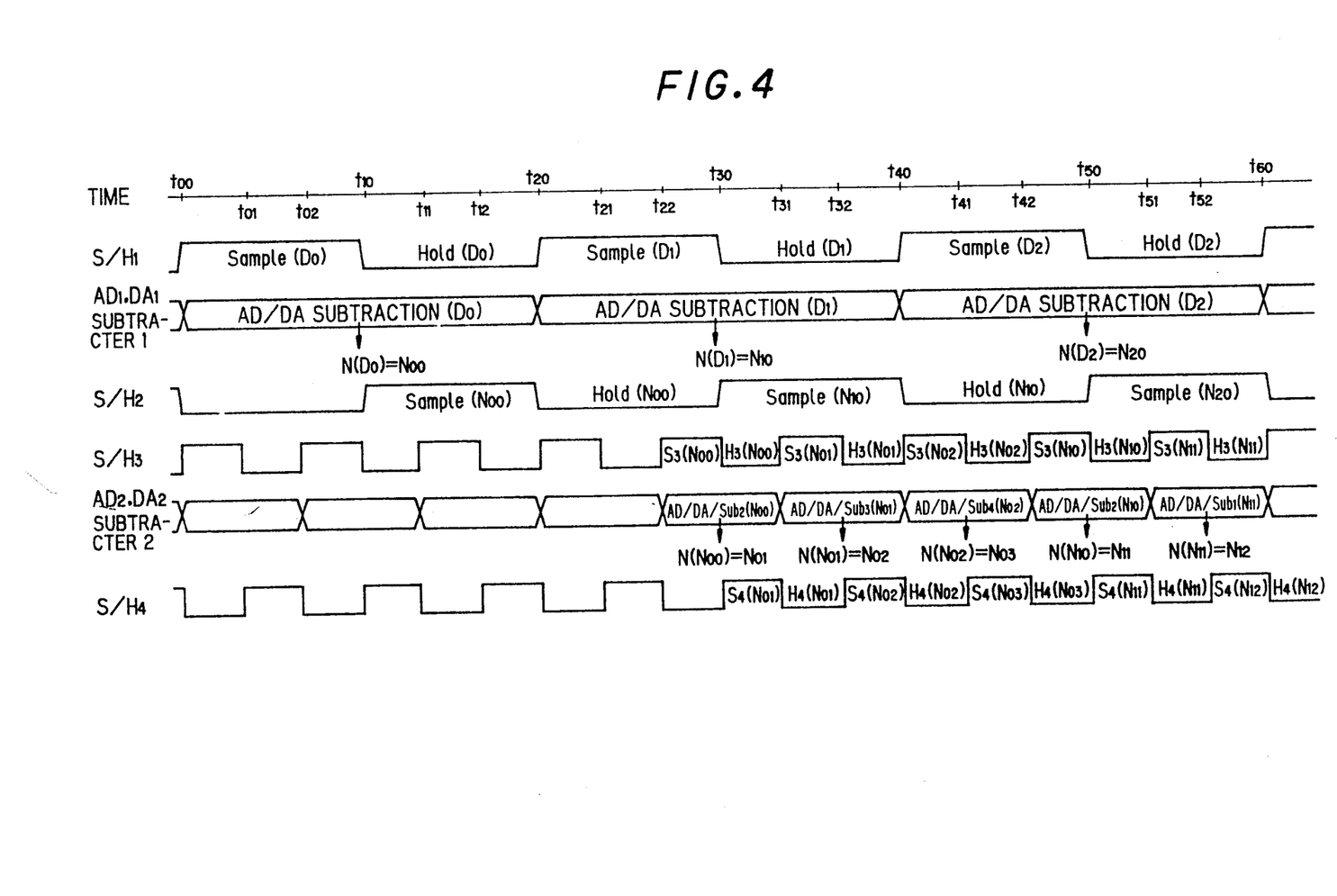
FIG. 4 is a timing chart of operation in the serial-parallel type A/D converter in the first preferred embodiment according to the invention.

FIG. 4 is a timing chart of operation in the serial-parallel A/D converter in the first preferred embodiment. Here, it is supposed that m=3.

In operation, in the first circuit block, the first sample holding circuit 21 becomes a sampling state at the time $t_{00}$ for sampling the input analogue signal until the time $t_{10}$ at which it samples the input analogue signal to obtain a sampled input analogue signal $D_0$. After sampling, the first sample holding circuit 21 holds the sampled input analogue signal $D_0$ during the period $t_{10}$ to $t_{20}$. Then, the first sample holding circuit 21 becomes a sampling state again at the time $t_{20}$ for sampling the input analogue signal $D_1$ as a next sample until the time $t_{30}$. In such a manner, the first sample holing circuit 21 becomes sampling and holding states alternately at the times $t_{00}, t_{10}, t_{20}, \ldots$.

The 4-bit parallel A/D converter 22 converts the input analogue signal $D_0$ to a first 4-bit digital code number corresponding to a first highest significant bits of the input analogue signal $D_0$. Then, the D/A converter 23 converts the first 4-bit digital code number supplied from the 4-bit parallel A/D converter 22 to a first analogue signal which corresponds to the first highest significant bits of the input analogue signal $D_0$. Then, the subtracter 24 subtracts the first analogue signal from the the sampled input analogue signal $D_0$ and amplifies the result of subtraction by four times. These operations of the 4-bit parallel A/D converter 22, the D/A converter 23 and the subtracter 24 finish by the time $t_{20}$.

The second sample holding circuit 25 becomes a sampling state at the time $t_{10}$ for sampling an output signal of the subtracter 24 until it samples the output signal at the time $t_{20}$, and amplifies the sampled signal by twice and holds the result of the amplified signal until the time $t_{30}$. Then, the second sample holding circuit 25 becomes a sampling state at the time $t_{30}$ for sampling an output signal of the subtracter 24 as a next sample. In such a manner, the sample holing circuit 25 becomes sampling and holding states alternately at the times $t_{00}, t_{10}, t_{20}, \ldots$.

As a result, the second sample holding circuit 25 supplies the terminal B with an output signal which is a value amplified by eight times of the result of subtraction of the first analogue signal supplied by the D/A converter 23.

In the second circuit block, the switch 36 connects the terminal A with the terminal B to receive the output signal from the terminal B. The sample holding circuit 31 becomes a sampling state at the time $t_{21}$ for sampling the output signal of the second sample holding circuit 25 until at the time $t_{30}$ at which it samples the output signal. After sampling, the first sample holding circuit 31 holds the sampled output signal during the period $t_{30}$ to $t_{31}$. Then, the first sample holding circuit 21 becomes a sampling state again at the time $t_{20}$ for sampling the input analogue signal as a next sample until the time $t_{30}$.

The 4-bit parallel A/D converter 32 converts the sampled output signal of the second sample holding circuit 25 to a second 4-bit digital code number corresponding to a second highest significant bits of the input analogue signal. Then, the D/A converter 33 converts the second 4-bit digital code number $N_2(D_0)$ supplied from the 4-bit parallel A/D converter 32 to a second analogue signal which corresponds to the second highest significant bits of the input analogue signal $D_0$. Then, the subtracter 34 subtracts the second analogue signal from the the sampled output signal of the sample holding circuit 25 and amplifies the result of subtraction by four times. These operations of the 4-bit parallel A/D converter 32, the D/A converter 33 and the subtracter 34 finish by the time $t_{31}$.

The second sample holding circuit 35 becomes a sampling state at the time $t_{30}$ for sampling an output signal of the subtracter 34, and amplifies the sampled signal by twice and holds the amplified value until at the time $t_{32}$, and supplies the terminal A with an output signal which is a signal amplified by eight times of the result of subtraction of the second analogue signal supplied by the D/A converter 33 from the sampled output signal of the sample holding circuit 25, after the switch 36 connects the terminal A with the terminal C. And, the second and third cycles of converting operation for obtaining third and fourth 4-bit digital code numbers corresponding to third and fourth highest significant bits of the input analogue signal are carried out. In short, the input analogue signal $D_0$ is held by the first sample holding circuit 21, and is simultaneously converted to provide the first 4-bit code number by the 4-bit parallel A/D converter 22. The first 4-bit code number is converted to provide the first analogue signal by the D/A converter 23, and the subtraction is carried out between the held analogue signal $D_0$ and the first analogue signal. This subtraction is indicated by $N(D_0)$, and the subtracted result is indicated by $N_{00}$. The subtracted result $N_{00}$ is held by the first sample holding circuit 31 in the second circuit block, and is simultaneously converted to provide the second 4-bit code number by the 4-bit parallel A/D converter 32. The second 4-bit code number is converted to provide the second analogue signal by the D/A converter 33, and the subtraction is carried out between the held analogue signal $N_{00}$ and the second analogue signal. This subtraction is indicated by $N(N_{00})$, and the subtracted result is indicated by $N_{01}$. The subtracted result $N_{01}$ is held in the second circuit block by the second sample holding circuit 35, and is simultaneously converted to provide the third 4-bit code number by the 4-bit parallel A/D converter 32. The third 4-bit code number is converted to provide the third analogue signal by the D/A converter 33, and subtraction is carried out between the held analogue signal $N_{01}$ and the third analogue signal. This subtraction is indicated by $N(N_{01})$, and the subtracted result is indicated by $N_{02}$. The subtracted result $N_{02}$ is held by the second sample holding circuit 35, and is simultaneously converted to provide the fourth 4-bit code number by the 4-bit parallel A/D converter 32. Although the fourth 4-bit code number is converted to provide the fourth analogue signal by the D/A converter 33, and the subtraction $N(N_{02})$ is carried out to provide the result $N_{03}$, these operations are no longer necessary. The first to fourth 4-bit code numbers are combined to provide a 13-bit digital signal, as described before.

In the serial-parallel type A/D converter, the operation is carried out in pipe lining way through the first and second circuit blocks, so that the A/D conversion operation time of the input analogue signal to a 13-bit digital code number depends on the converting operation times in either the first or second circuit block.

In practical operation, the relation between the converting periods $T_{s1}$ and $T_{s2}$ in the first and second circuit blocks is as follows, as clearly shown in FIG. 4.

$$T_{s1} = 3T_{s2}$$

The first circuit block needs the precision of A/D conversion equal to 13 bits. The 13-bit precision corresponds to:

$$(\tfrac{1}{2}) \cdot (\tfrac{1}{2}^{13}) = 0.0061\%$$

If the first circuit block consists of a circuit realized by the same technical level, $T_{s1}$ becomes as follows.

$$T_{s1} = T_{s0} = 1.25 \ \mu s$$

However, the second circuit block needs the precision of A/D conversion equal to 10 bits. The 10-bit precision corresponds to:

$$(\tfrac{1}{2}) \cdot (\tfrac{1}{2}^{10}) = 0.049\%$$

Therefore, the precision needed in the second circuit block is one eighth of that needed in the first circuit block, so that the converting period can be set to $T_{s2}$ in the second circuit block to be equal to or below $(\tfrac{1}{3}) \cdot T_{s1}$. In this embodiment, $T_{s2}$ is set as follows.

$$T_{s2} \leq (\tfrac{1}{3}) \cdot (1.25) \ \mu s = 0.417 \ \mu s$$

It will be confirmed by "P5-271 of Spring Term National Conference Report in Electro Information Communication Society, 1989".

Consequently, the converting time in the serial-parallel type A/D converter in the first preferred embodiment becomes one fourth of that in the first conventional serial-parallel type A/D converter, although the consumption power and the chip area thereof becomes up to twice.

Figure 5:
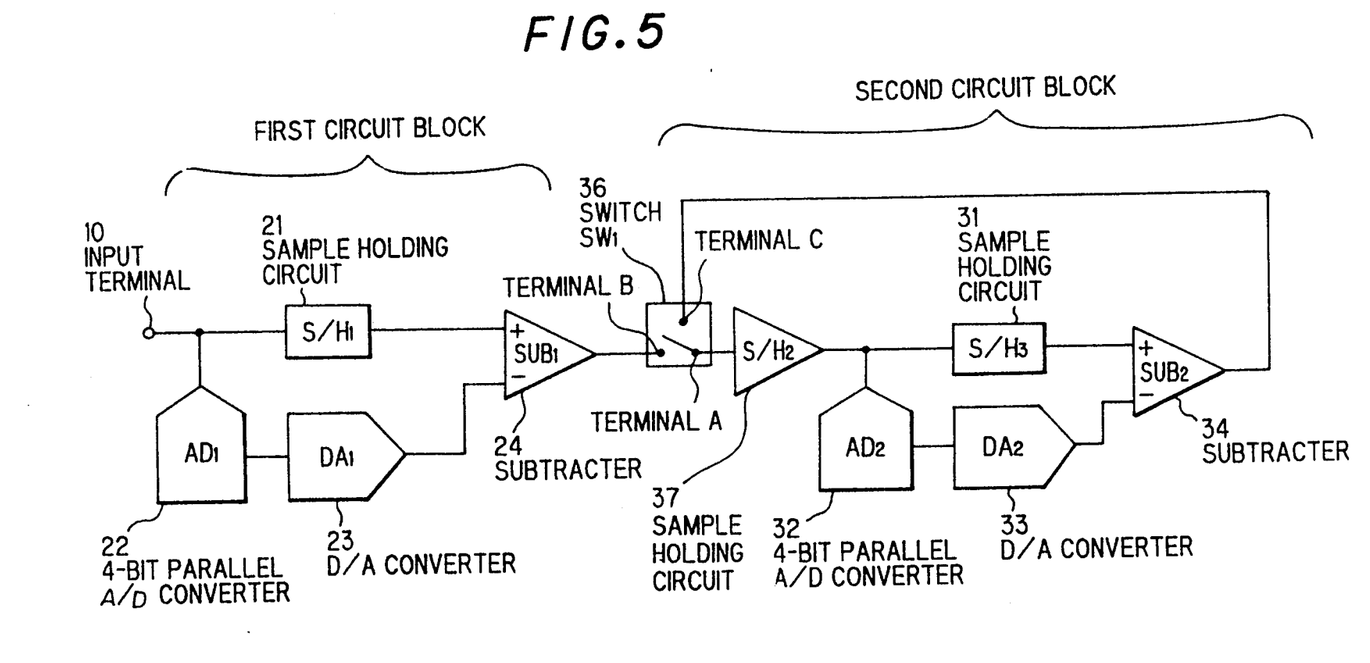
FIG. 5 is a block diagram of a serial-parallel type A/D converter in a second preferred embodiment according to the invention.

FIG. 5 is a block diagram of a serial-parallel A/D converter in a second preferred embodiment. The basic structure of the serial-parallel A/D converter in the second preferred embodiment is the same as that in the first preferred embodiment, except that the sample holding circuits 25 and 35 in the first preferred embodiment is replaced by a sample holding circuit 37 in the second preferred embodiment. The number of electric elements composing the serial-parallel type A/D converter in the second preferred embodiment is reduced as compared with that in the first preferred embodiment, so that the operation time becomes shorter as compared with that in the first preferred embodiment.

In other preferred embodiment, the sample holding circuit 21 in FIG. 3 or FIG. 5 may be located just after the input terminal 10.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A serial-parallel type A/D converter, comprising:
   a first circuit block for converting an input analogue signal to a first digital code number consisting of first highest significant bits;
   a second circuit block for converting an analogue signal, which is obtained by subtracting an analogue signal equivalent in value to said first digital code number from said input analogue signal, to second and later digital code numbers consisting of second and later highest significant bits, respectively, said second circuit block being a recursive circuit in which said converting is carried out for plural times at a timing faster than that of said first circuit block to obtain said second and later digital code numbers;
   wherein said first and second circuit block operates in pipe lining to convert said input analogue signal to a digital signal obtained by combining said first, second and later highest significant bits.

2. A serial-parallel type A/D converter, comprising:
   a first circuit block for converting an input analogue signal to a first digital code number consisting of first highest significant bits;
   a second circuit block for converting an analogue signal, which is obtained by subtracting an analogue signal equivalent in value to said first digital code number from said input analogue signal, to second and later digital code numbers consisting of second and later highest significant bits, respectively, said second circuit block being a recursive circuit in which said converting is carried out for plural times at a timing faster than that of said first circuit block to obtain said second and later digital code numbers;
   wherein said first and second circuit block operates in pipe lining to convert said input analogue signal to a digital signal obtained by combining said first, second and later highest significant bits, wherein:
   said first circuit block comprises:
      a first sample holding circuit which samples and holds said input analogue signal;
      a first parallel A/D converter which converts said input analogue signal to said first digital code number;
      a first D/A converter which converts said first digital code number supplied from said first parallel A/D converter to a first converted analogue signal;
      a first subtracter which subtracts said first converted analogue signal supplied from said first D/A converter from an output signal of said first sample holding circuit; and
      a second sample holding circuit which samples and holds an output of said first subtracter to generate a second input signal; and
   said second circuit block comprises:
      a second parallel A/D converter which converts said second input signal supplied from said first subtracter to a second or later digital code number;
      a third sample holding circuit which samples and holds said second input signal supplied from said first subtracter;
      a second D/A converter which converts said second or later digital code number supplied from said second parallel A/D converter to a second converted analogue signal;
      a second subtracter which subtracts said second converted analogue signal supplied from said second D/A converter from an output signal of said third sample holding circuit;

a fourth sample holding circuit which samples and holds an output of said second subtracter to generate a third input signal; and a switch which selectively connects a first terminal connected to inputs of said second parallel A/D converter and said third sample holding circuit with either a second terminal connected to an output of said second sample holding circuit or a third terminal connected to an output of said fourth sample holding circuit.

3. A serial-parallel type A/D converter, according to claim 2 wherein:

said first parallel A/D converter and said first subtracter operate with a period $T_{S1}$, and said second parallel A/D converter and said second subtracter operate with a period $T_{S2}$, said periods $T_{S1}$ and $T_{S2}$ meeting an equation "$T_{S1}=mT_{S2}$", where m is an integer which is equal to or more than 2.

4. A serial-parallel type A/D converter, according to claim 2, wherein:

said first and second subtracters and said first and third sample holding circuits include amplifiers each having a predetermined amplifying factor.

5. A serial-parallel type A/D converter, according to claim 2, wherein:

said first and second subtracters and said first and second sample holding circuits include amplifiers each having a predetermined amplifying factor.

6. A serial-parallel type A/D converter, comprising:

a first circuit block for converting an input analogue signal to a first digital code number consisting of first highest significant bits;

a second circuit block for converting an analogue signal, which is obtained by subtracting an analogue signal equivalent in value to said first digital code number from said input analogue signal, to second and later digital code numbers consisting of second and later highest significant bits, respectively, said second circuit block being a recursive circuit in which said converting is carried out for plural times at a timing faster than that of said first circuit block to obtain said second and later digital code numbers;

wherein said first and second circuit block operates in pipe lining to convert said input analogue signal to a digital signal obtained by combining said first, second and later highest significant bits, wherein:

said first circuit block comprises:

a first sample holding circuit which samples and holds said input analogue signal;

a first parallel A/D converter which converts said input analogue signal to said first digital code number;

a first D/A converter which converts said first digital code number supplied from said first parallel A/D converter to a first converted analogue signal; and a first subtracter which subtracts said first converted analogue signal supplied from said first D/A converter from an output signal of said first sample holding circuit; and said second circuit block comprises:

a second sample holding circuit which samples and holds a signal selected from output signals of said first and second circuit blocks;

a third sample holding circuit which samples and holds said signal supplied from said second sample holding circuit;

a second parallel A/D converter which converts an output of said second sample holding circuit to a second or later digital code number;

a second D/A converter which converts said second or later digital code number supplied from said second parallel A/D converter to a second converted analogue signal;

a second subtracter which subtracts said second converted analogue signal supplied from said second D/A converter from an output signal of said third sample holding circuit; and a switch which selectively connects a first terminal connected to an input of said second sample holding circuit with either a second terminal connected to an output of said first subtracter or a third terminal connected to an output of said second subtracter.

7. A serial-parallel type A/D converter, according to claim 6 wherein:

said first parallel A/D converter and said first subtracter operate with a period $T_{s1}$, and said second parallel A/D converter and said second subtracter operate with a period $T_{s2}$, said periods $T_{s1}$ and $T_{s2}$ meeting an equation "$T_{s1}=mT_{s2}$", where m is an integer which is equal to or more than 2.

* * * * *